US012437958B2

(12) United States Patent
Ohshima et al.

(10) Patent No.: US 12,437,958 B2
(45) Date of Patent: Oct. 7, 2025

(54) ELECTRON BEAM APPLICATION DEVICE

(71) Applicant: Hitachi High-Tech Corporation, Tokyo (JP)

(72) Inventors: Takashi Ohshima, Tokyo (JP); Hideo Morishita, Tokyo (JP); Tatsuro Ide, Tokyo (JP); Hiroyasu Shichi, Tokyo (JP); Yoichi Ose, Tokyo (JP); Junichi Katane, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 391 days.

(21) Appl. No.: 18/028,771

(22) PCT Filed: Nov. 10, 2020

(86) PCT No.: PCT/JP2020/041811

§ 371 (c)(1),
(2) Date: Mar. 28, 2023

(87) PCT Pub. No.: WO2022/101957

PCT Pub. Date: May 19, 2022

(65) Prior Publication Data

US 2023/0335367 A1 Oct. 19, 2023

(51) Int. Cl.
*H01J 37/06* (2006.01)
*H01J 37/244* (2006.01)
(Continued)

(52) U.S. Cl.
CPC ............ *H01J 37/06* (2013.01); *H01J 37/244* (2013.01); *H01J 37/28* (2013.01); *C23C 14/14* (2013.01); *H01J 2237/24535* (2013.01)

(58) Field of Classification Search
None
See application file for complete search history.

(56) References Cited

U.S. PATENT DOCUMENTS 3,669,735 A 6/1972 Fisher
4,772,821 A 9/1988 Hosoki et al.
(Continued)

FOREIGN PATENT DOCUMENTS

CN 107230606 A 10/2017
JP 47-005465 A 3/1972
(Continued)

OTHER PUBLICATIONS

Japanese Office Action received in corresponding Japanese Application No. 2022-561703 dated Dec. 5, 2023.
(Continued)

*Primary Examiner* — James Choi
(74) *Attorney, Agent, or Firm* — Mattingly & Malur, PC

(57) ABSTRACT

An activation mechanism is provided in an activation region of an electron gun, and includes a light source device 3 configured to irradiate a photocathode with excitation light, a heat generating element, an oxygen generation unit configured to generate oxygen by heating the heat generating element, and an emission current meter configured to monitor an emission current generated by electron emission when the photocathode 1 is irradiated with the excitation light from the light source device. In a surface activation process, the photocathode is irradiated with the excitation light from the light source device, an emission current amount of the photocathode is monitored by the emission current meter, the heat generating element is heated to generate oxygen by the oxygen generation unit, and the heating of the heat generating element is stopped when the emission current amount of the photocathode satisfies a predetermined stop criterion.

15 Claims, 11 Drawing Sheets

(51) Int. Cl.
*H01J 37/28* (2006.01)
*C23C 14/14* (2006.01)

(56) References Cited

U.S. PATENT DOCUMENTS

| | | | | |
|---|---|---|---|---|
| 2007/0087130 | A1 | 4/2007 | Arai | |
| 2023/0230794 | A1 * | 7/2023 | Nishitani | H01J 37/073 250/492.3 |

FOREIGN PATENT DOCUMENTS

| | | | | |
|---|---|---|---|---|
| JP | 62-076143 | A | 4/1987 | |
| JP | 9-245637 | A | 9/1997 | |
| JP | 2002-313273 | A | 10/2002 | |
| JP | 2007-107047 | A | 4/2007 | |
| WO | WO-2024262001 | A1 * | 12/2024 | H01J 1/34 |

OTHER PUBLICATIONS

Makoto Kuwahara et al., "Coherence of a spin-polarized electron beam emitted from a semiconductor photocathode in a transmission electron microscope", Applied Physics Letters 105, 193101 (2014).
Hideo Morishita et al., "Resolution improvement of low-voltage scanning electron microscope by bright and monochromatic electron gun using negative electron affinity photocathode", Journal of Applied Physics 127, 164101 (2020).
R Speidel et al., "A solid state oxygen source for uhv", Vacuum, vol. 38, No. 2, pp. 89 to 92, 1988.
C. Y. Yang et al., "Novel oxygen source for ultrahigh vacuum studies", Journal of Vacuum Science and Technology 20, 1056 (1982).
International Search Report of PCT/JP2020/041811 dated Jan. 19, 2021.

* cited by examiner

[FIG. 1A]
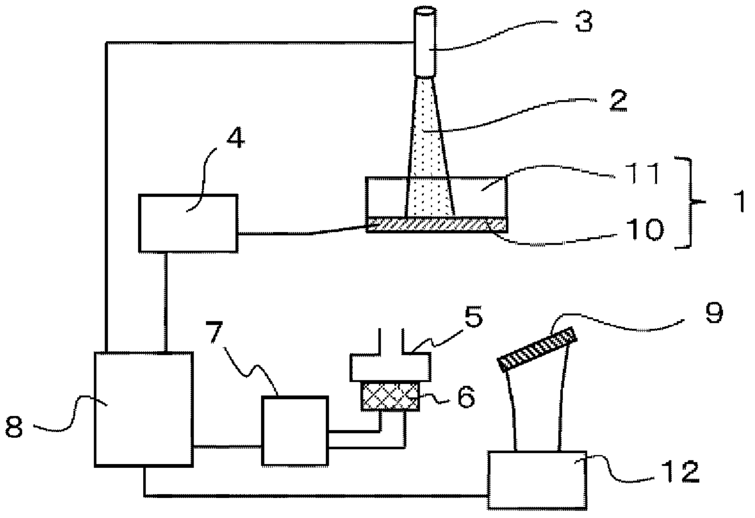
[FIG. 1B]
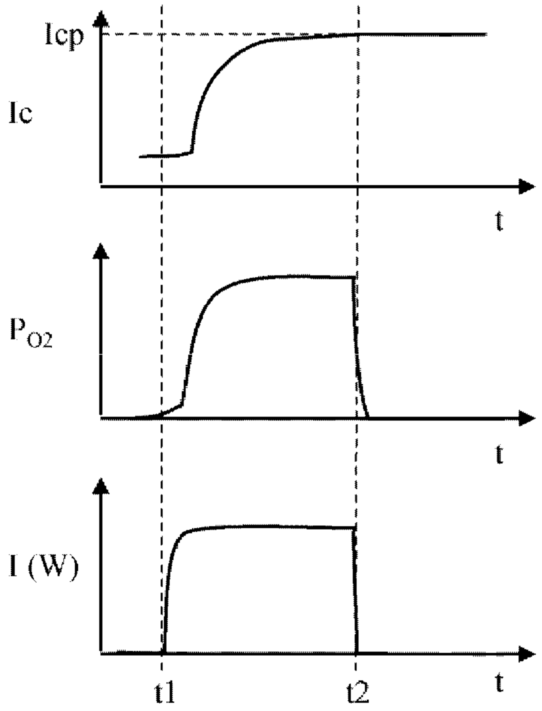

[FIG. 1C]
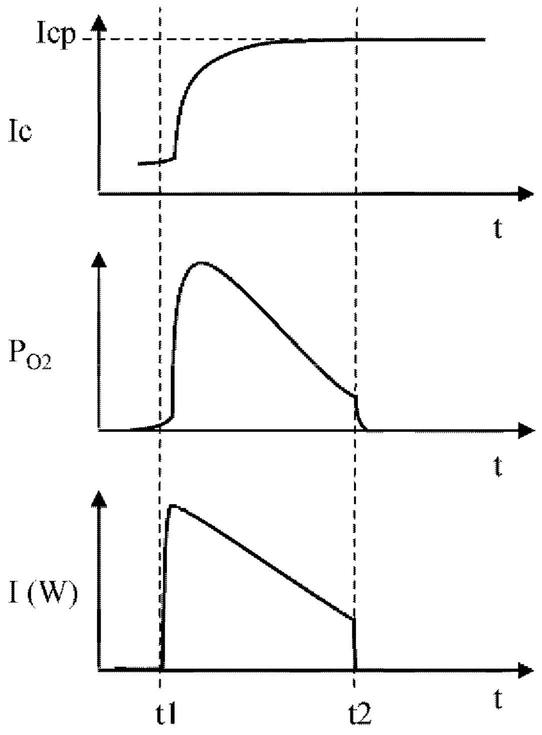
[FIG. 2]
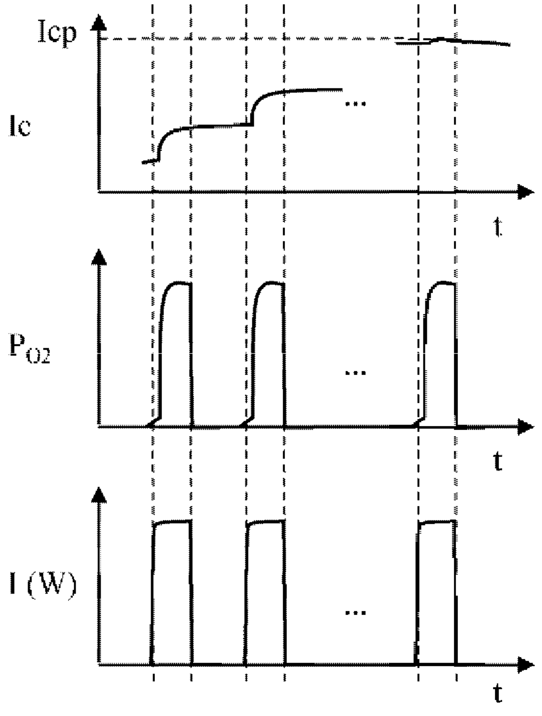

[FIG. 3]
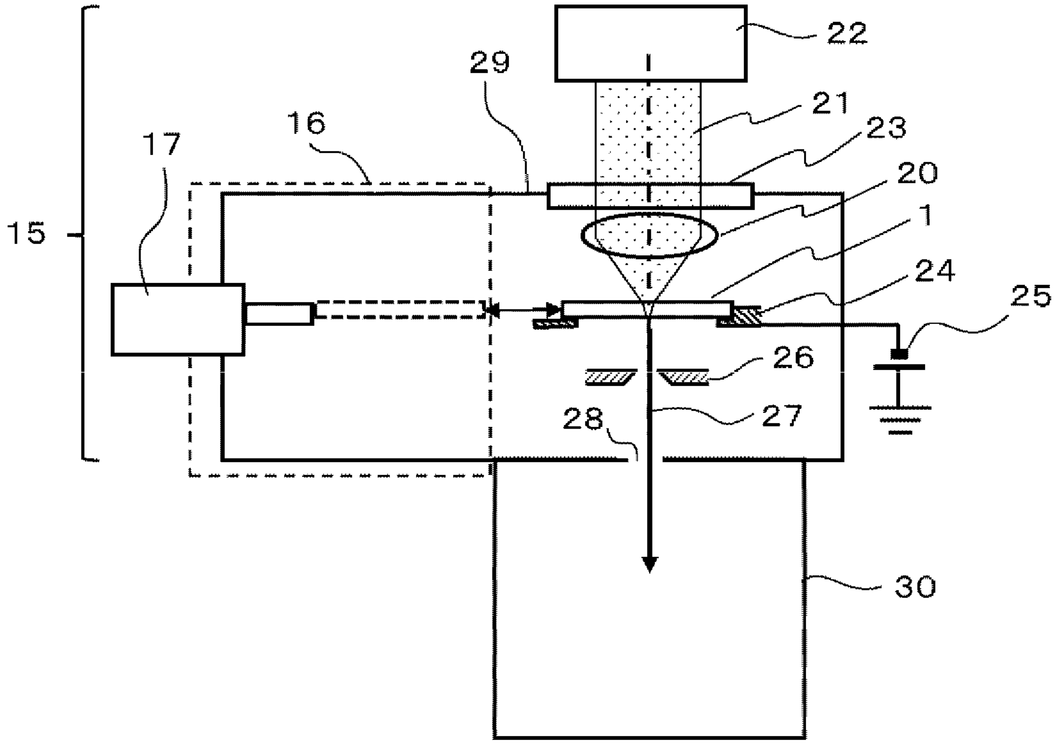
[FIG. 4A]
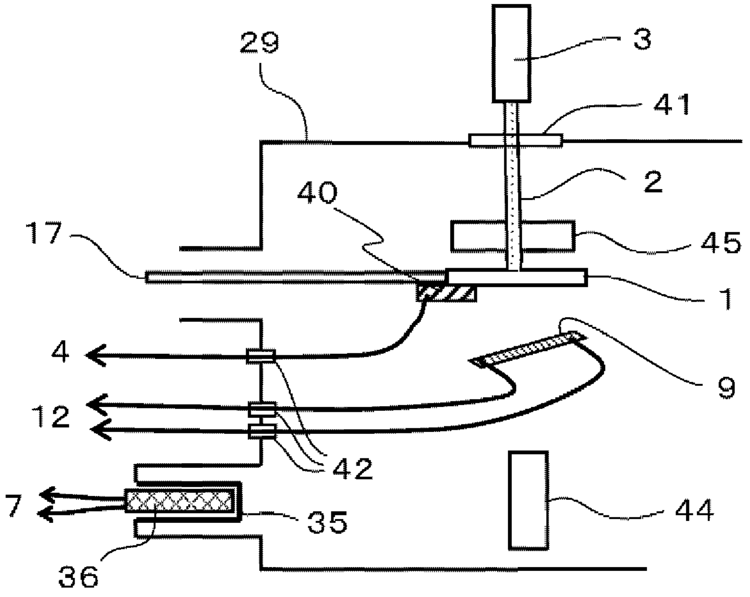

[FIG. 4B]
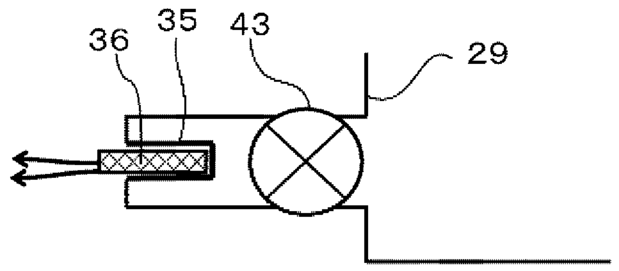
[FIG. 4C]
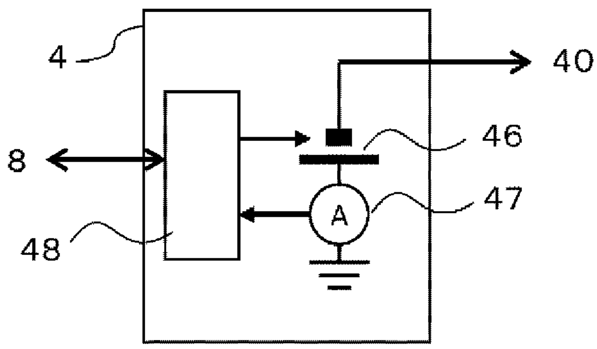
[FIG. 5A]
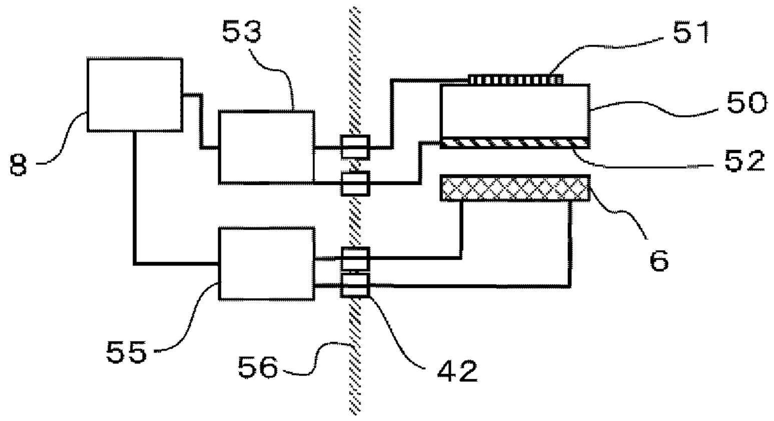

[FIG. 5B]
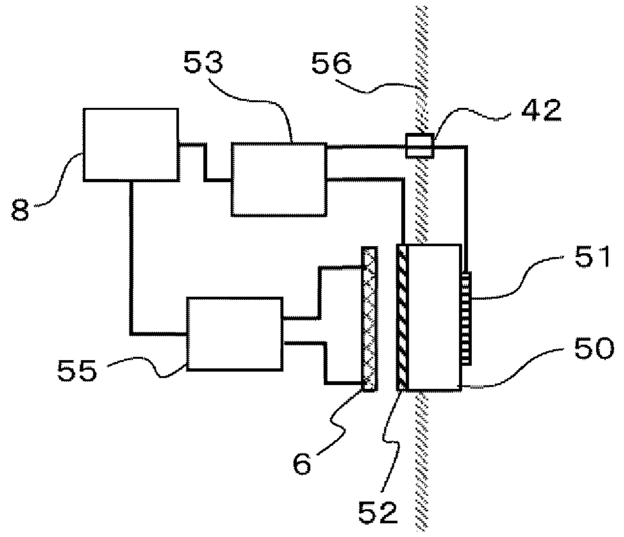
[FIG. 5C]
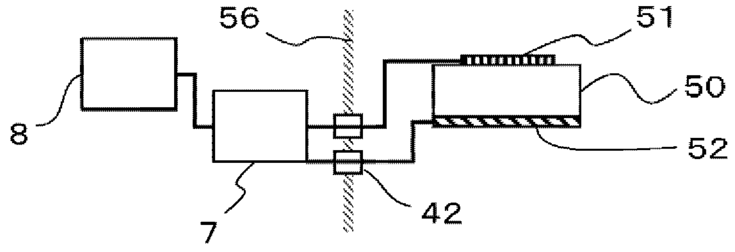

[FIG. 6]
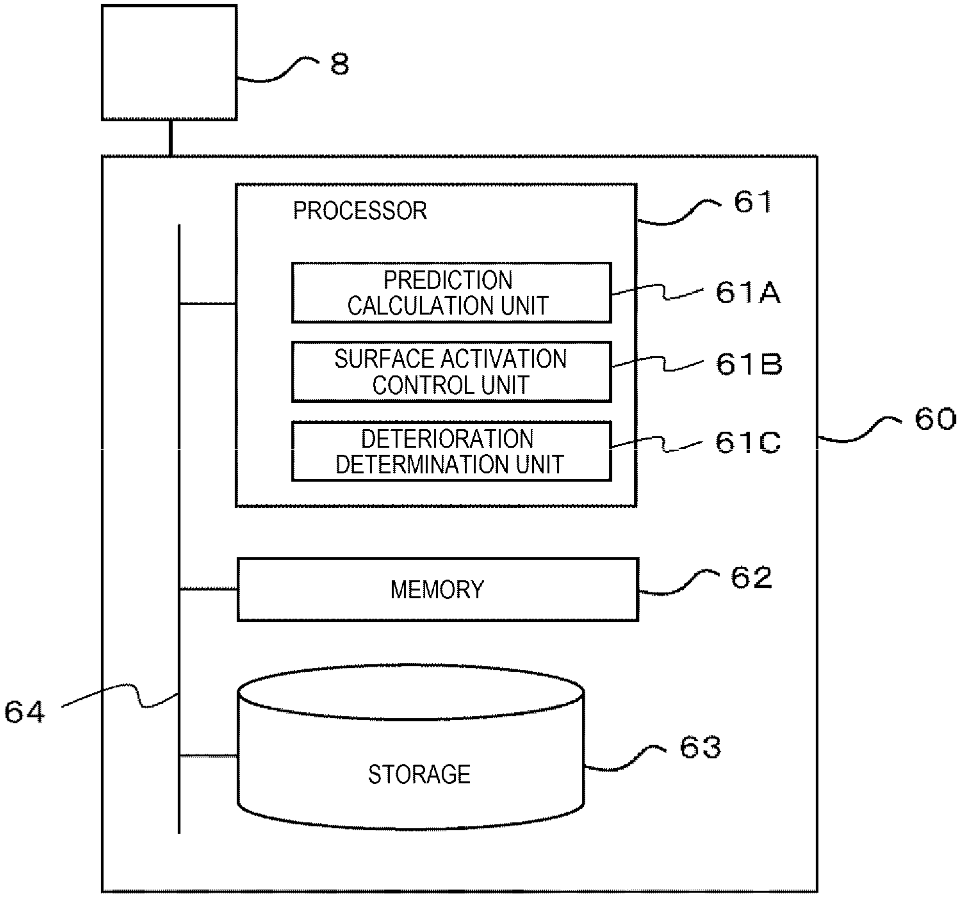

[FIG. 7]
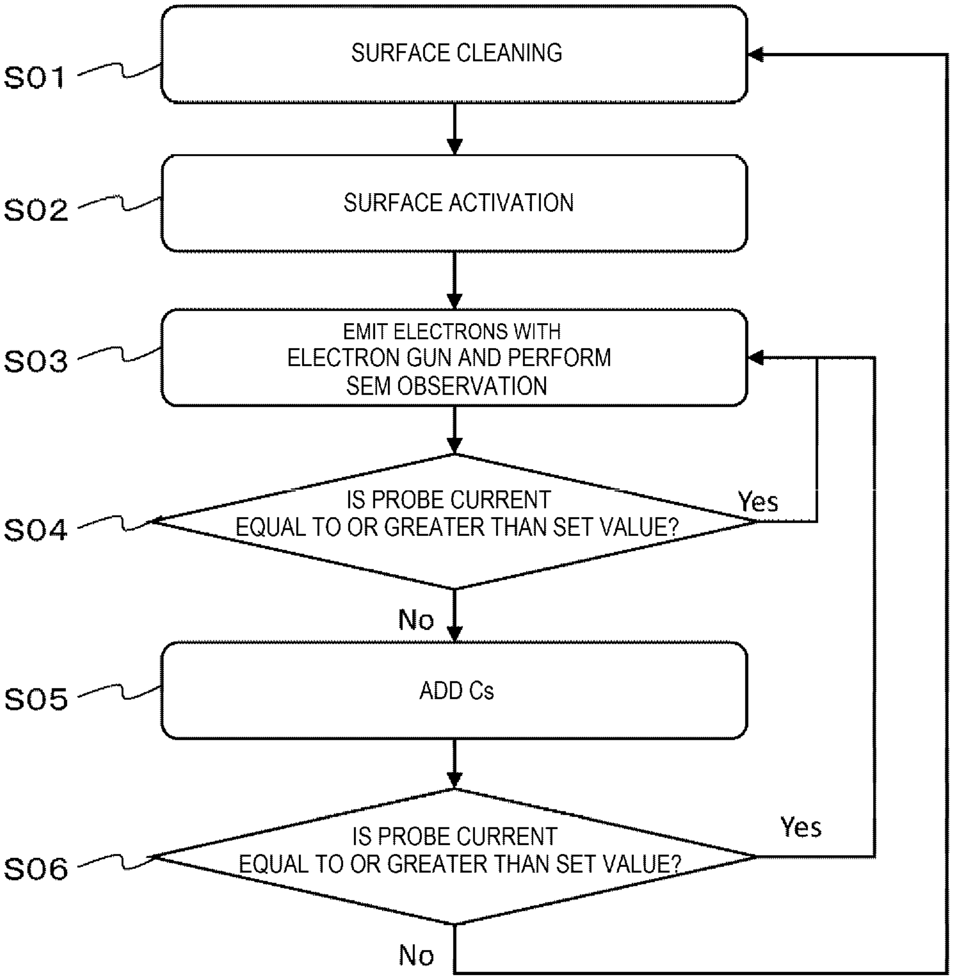

[FIG. 8]
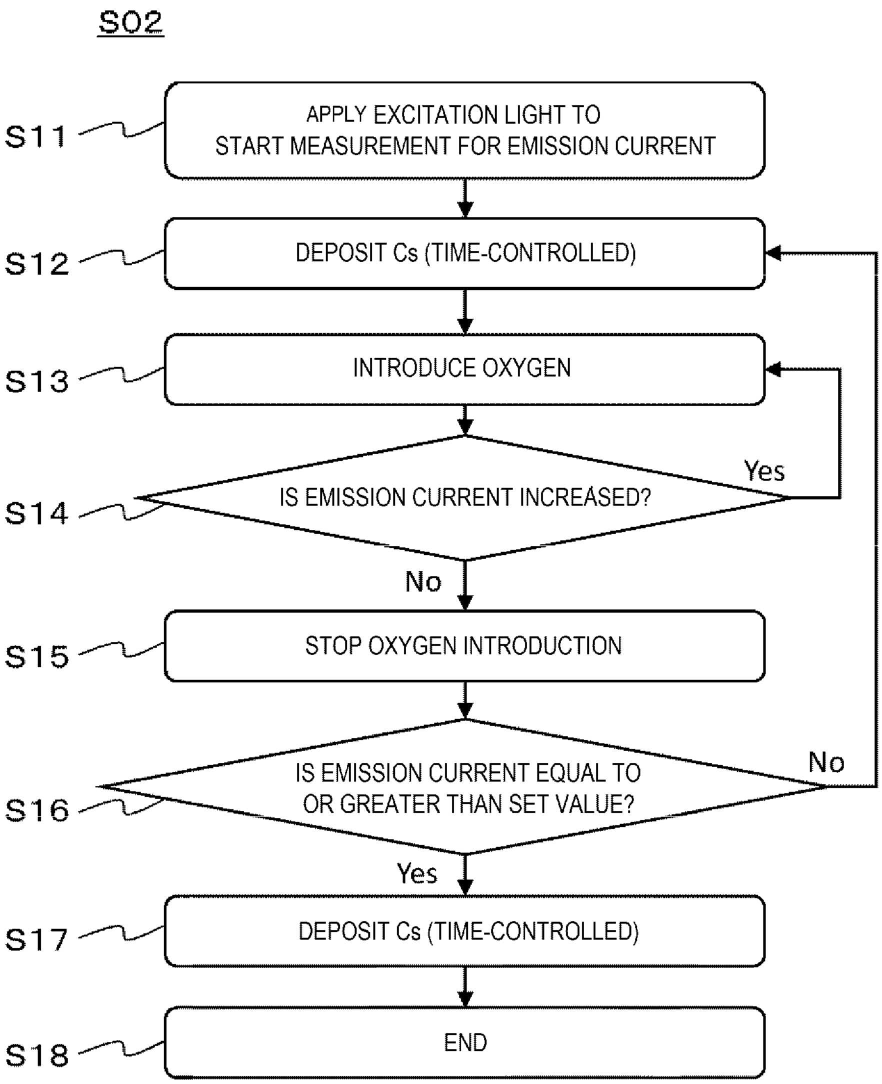

[FIG. 9A]
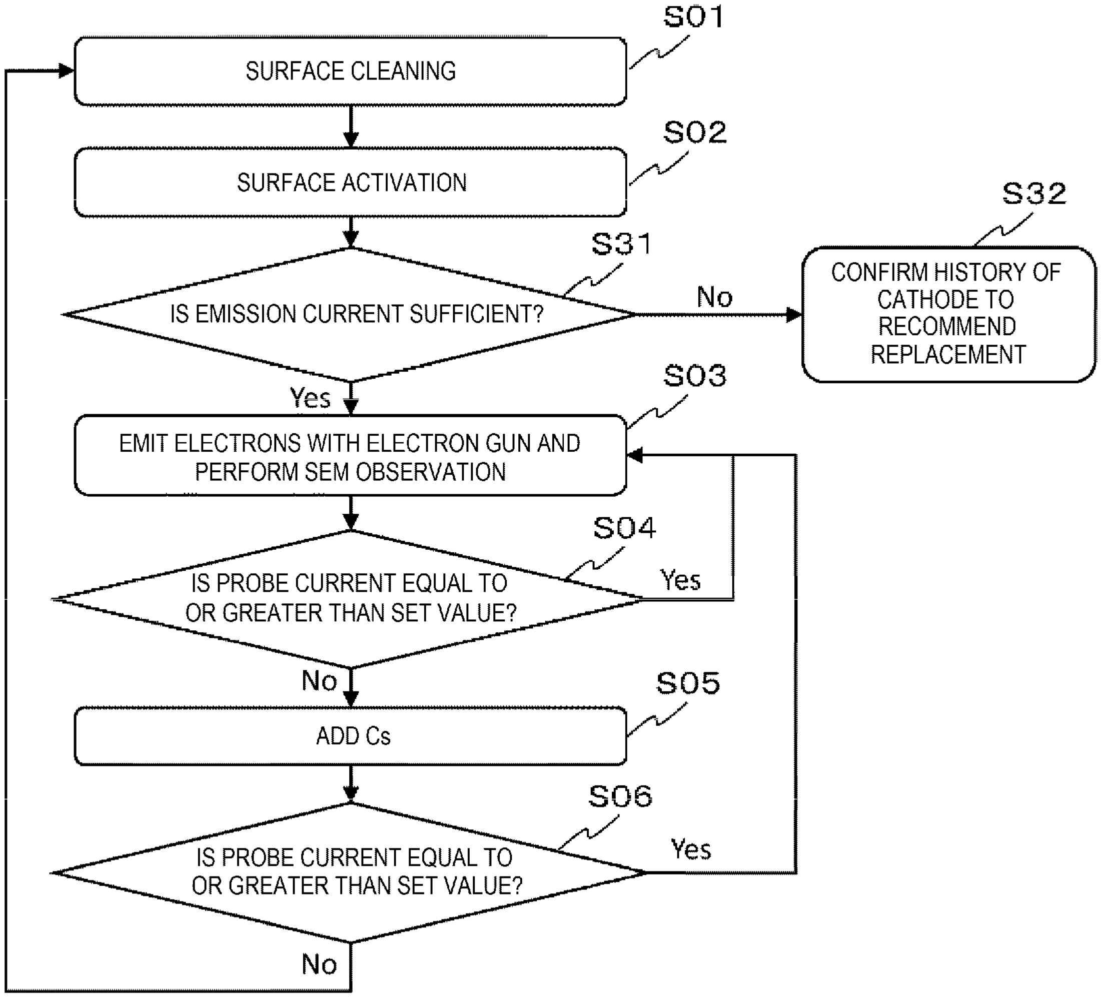
[FIG. 9B]
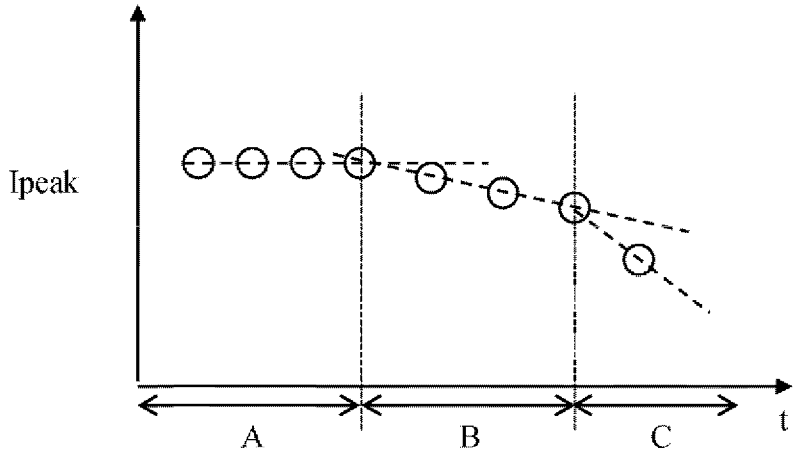

[FIG. 10]
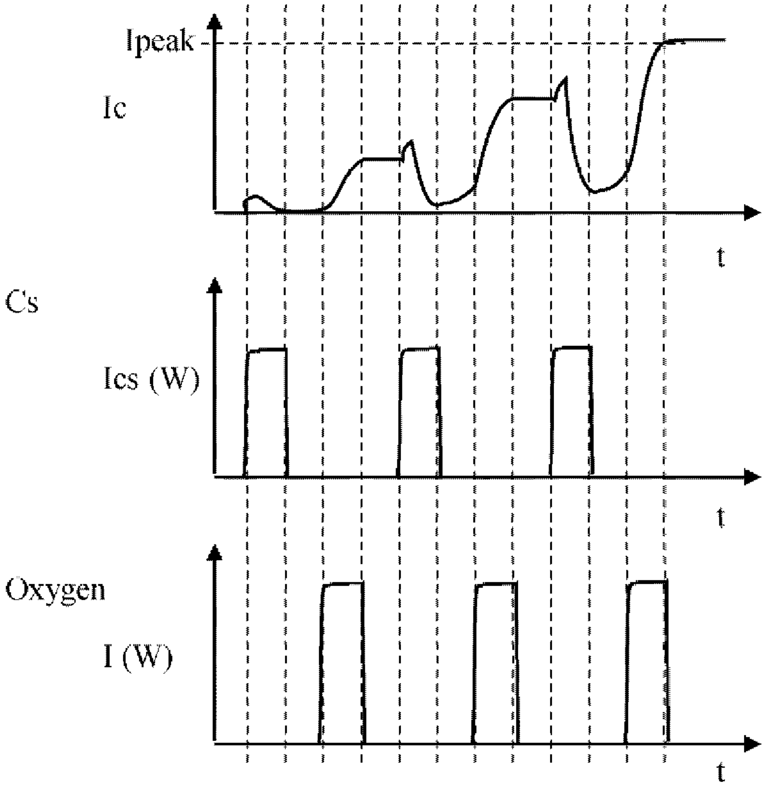

[FIG. 11]
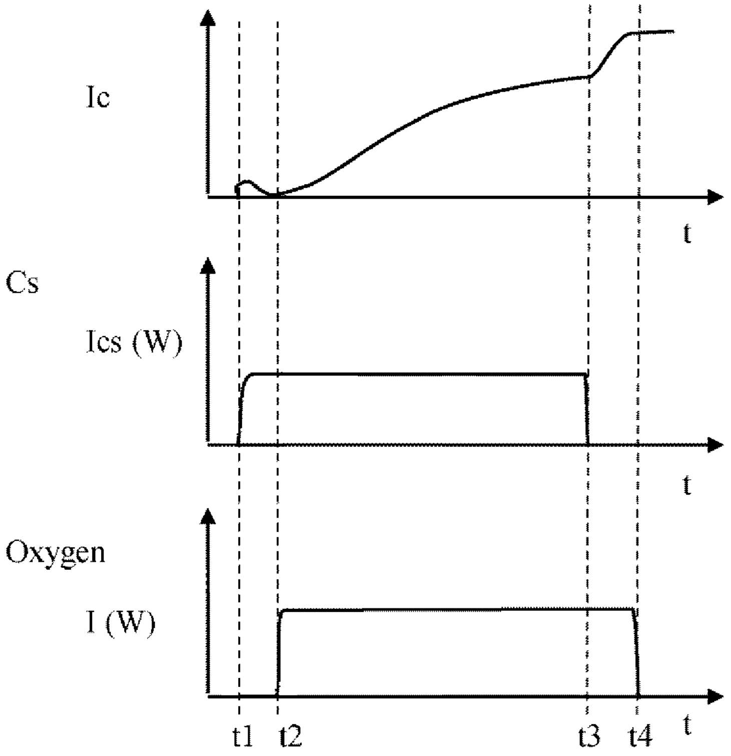

ELECTRON BEAM APPLICATION DEVICE

TECHNICAL FIELD

The present invention relates to an electron beam application device such as an electron microscope using a photocathode as an electron source.

BACKGROUND ART

In a high-resolution electron microscope, an electron source having high luminance and a small energy width of an electron beam to be emitted, that is, a monochromatic electron source, is essential. A photoexcited electron source using negative electron affinity (NEA) has an extremely small energy width, exceeds a high performance electron source in the related art, and has a feature that linearity of an emitted electron is good. As shown in PTL 1, excitation light is concentrated to about a diffraction limit of light to form a small light source region of about 1 μm, and high luminance can be implemented by increasing a current density. For example, with respect to a transmission electron microscope in NPL 1 and a scanning electron microscope in NPL 2, a high resolution property is reported.

A step of forming a film having a low work function on a surface of a photoelectric film (for example, a p-type GaAs layer) of a photocathode that emits an electron upon incidence of light is called a surface activation process. Specifically, a cesium (Cs)—O adsorption layer is formed by adding an appropriate amount of Cs and oxygen to the surface of the photoelectric film in an electron gun or in a vacuum layer adjacent to the electron gun. As a procedure of the surface activation, a Yo-Yo method is known. In the Yo-Yo method, Cs and oxygen are alternately supplied in a state in which a photocathode on which surface activation is performed is irradiated with the excitation light, and an emission current from the photocathode is maximized.

As a method of introducing oxygen into a vacuum, in addition to a method of introducing oxygen from an oxygen cylinder, a method of generating oxygen by heating an oxygen source as shown in PTL 2, NPL 3, and NPL 4 is known.

CITATION LIST

Patent Literature

PTL 1: JP2002-313273A
PTL 2: JPS62-76143A

Non Patent Literature

NPL 1: M. Kuwahara et al., "Coherence of a spin-polarized electron beam emitted from a semiconductor photocathode in a transmission electron microscope", Applied Physics Letters, Vol. 105, Paper No. 193101, 2014
NPL 2: H. Morishita et al., "Resolution improvement of low-voltage scanning electron microscope by bright and monochromatic electron gun using negative electron affinity photocathode", Journal of Applied Physics, Vol. 127, Paper No. 164902, 2020
NPL 3: R. Speidel et al., "A solid state oxygen source for uhv", Vacuum, Vol. 38, number 2, pp. 89 to 92, 1988
NPL 4: C. Y. Yang et al., "Novel oxygen source for ultrahigh vacuum studies", Journal of Vacuum Science & Technology, Vol. 20, pp. 1056 to 1059, 1982

SUMMARY OF INVENTION

Technical Problem

PTL 1 discloses that introduction of oxygen for surface activation is performed using an oxygen cylinder and a variable leak valve. This is because of a reason as follows. The amount of oxygen required for one time of introduction is extremely small, which is about 1 Langmuir or less. That is, the amount of oxygen adsorbed on the surface of the photoelectric film is equal to or less than a monomolecular layer, and when the amount of oxygen exceeds the monomolecular layer, the current is remarkably reduced, which hinders activation. Therefore, typically, an oxygen partial pressure at the time of oxygen introduction in a surface activation process is in the order of $10^{-7}$ Pa, and an introduction time is several minutes. Such a low pressure control is impossible with a mechanical valve controlled by an electric signal at present, and the variable leak valve has to be manually controlled.

Further, in order to introduce an oxygen gas using the variable leak valve, an increase in oxygen partial pressure is monitored by a vacuum gauge to adjust a flow rate of oxygen; in the surface activation process, heating by energization is required for vaporizing and depositing Cs, and a gas pressure is increased by the heating. Therefore, the oxygen introduction cannot be performed until the gas pressure at the time of the Cs deposition becomes sufficiently low. As a consequence, the surface activation by a Yo-Yo method, in which the Cs deposition and the oxygen introduction are repeated, has required a total time of 1 to 2 hours or longer.

Accordingly, when the oxygen introduction for the surface activation is performed manually, a long time is required for the surface activation process, and a proficient skill of an operator of the variable leak valve is required to improve reproducibility, which leads to poor usability of the device.

PTL 1 discloses that, since the amount of oxygen used for the surface activation is extremely small, an oxygen source that generates oxygen gas may be used, and regarding this, oxygen may be introduced by providing a thin plate made of silver oxide or silver between the atmosphere and heating the plate. In contrast, the invention has paid attention to the possibility that the oxygen introduction can be performed through heating control by introducing oxygen using an oxygen source, thereby eliminating a manual labor control. When the surface activation process on the photocathode is automated, the usability of an electron beam application device using the photocathode as the electron source can be greatly improved.

Solution to Problem

An electron beam application device according to an aspect of the invention includes: an electron gun having an electron probe radiation region and an activation region, and including a photocathode configured to be transferred between the electron probe radiation region and the activation region; an electron optical system column into which an electron beam emitted by irradiating the photocathode disposed in the electron probe radiation region with excitation light is introduced; an activation mechanism disposed in the activation region; a control device configured to control the activation mechanism; and a computer configured to control the control device and execute a surface activation process on the photocathode by the activation mechanism. The activation mechanism includes a light source device configured to irradiate the photocathode disposed in the activation region with the excitation light, an alkali metal source configured to be deposited on a surface of the photocathode in the surface activation process, a first power source configured to energize the alkali metal source to generate alkali metal vapor, a heat generating element, an oxygen generation unit configured to generate oxygen by heating the heat generating element, and an emission current meter configured to monitor an emission current generated by electron emitted when the photocathode is irradiated with the excitation light from the light source device. In the surface activation process, the computer performs control such that the photocathode is irradiated with the excitation light from the light source device, an emission current amount of the photocathode is monitored by the emission current meter, the heat generating element is heated to generate oxygen by the oxygen generation unit, and the heating of the heat generating element is stopped when the emission current amount of the photocathode satisfies a predetermined stop criterion.

Advantageous Effects of Invention

Surface activation on the photocathode is automatically performed in a short time with good reproducibility and without requiring proficient skill, and thus usability of the electron beam application device using the photocathode as the electron source is improved.

Other technical problems and novel characteristics will be obvious from a description of the present description and the accompanying drawings.

BRIEF DESCRIPTION OF DRAWINGS

FIG. 1A is a configuration example of an activation mechanism for a photocathode.

FIG. 1B is a time chart of an oxygen introduction process.

FIG. 1C is a time chart of the oxygen introduction process.

FIG. 2 is a time chart of the oxygen introduction process.

FIG. 3 is a configuration example of an electron gun.

FIG. 4A is a configuration example of an activation region of the electron gun.

FIG. 4B is a configuration example of an oxygen generation unit.

FIG. 4C is a circuit configuration example of an emission current meter.

FIG. 5A is a configuration example of an oxygen generation unit using stabilized zirconia.

FIG. 5B is a configuration example of the oxygen generation unit using the stabilized zirconia.

FIG. 5C is a configuration example of the oxygen generation unit using the stabilized zirconia.

FIG. 6 is a block diagram of a computer that controls a control device.

FIG. 7 is a flowchart in which the photocathode is used as an electron source.

FIG. 8 is a flowchart of a surface activation process on the photocathode.

FIG. 9A is a flowchart in which the photocathode is used as the electron source.

FIG. 9B is a diagram showing a temporal change of the photocathode.

FIG. 10 is a time chart of the surface activation process (Yo-Yo method) on the photocathode.

FIG. 11 is a time chart of a surface activation process (co-deposition method) on the photocathode.

DESCRIPTION OF EMBODIMENTS

Hereinafter, embodiments of the invention will be described. FIG. 1A shows a configuration example of an activation mechanism that automates a surface activation process on a photocathode 1. The photocathode 1 has a structure in which a photoelectric film 10 is provided on a surface of a transparent substrate 11, and is a transmissive photocathode in which an electron emission surface and an excitation light incident surface face each other. As described in PTL 1 or NPL 1, the photoelectric film 10 is made of single crystal GaAs or a superlattice containing GaAs, and by lowering a work function on a surface, the photoelectric film 10 becomes an electron emission source with high luminance and uniform energy, that is, monochrome, using negative electron affinity (NEA).

During the activation on the photocathode 1, the photoelectric film 10 of the photocathode 1 is irradiated with excitation light 2 from a light source device 3 in a state in which an emission current meter 4 is electrically connected thereto. The emission current meter 4 monitors an emission current generated by electron emission from the photoelectric film 10. In order to lower the work function on the surface of the photoelectric film 10, the activation mechanism shown in FIG. 1A executes a Cs deposition process and an oxygen gas introduction process by a control device 8 as follows. First, a Cs source 9 is energized and heated by a Cs generation power source 12 to deposit Cs on the photoelectric film 10 for a predetermined time. At this time, the emission current measured by the emission current meter 4 increases once and decreases. Next, a heat generating element 6 is energized for a predetermined time by an oxygen generation power source 7 to heat the oxygen generation unit 5, thereby supplying a predetermined amount of oxygen to the photocathode 1. FIG. 1A illustrates a configuration in which the oxygen generation unit 5 contains a substance that generates oxygen by heating in a container such as a crucible, but a variety of forms are available as a form of the oxygen generation unit 5 as described later.

With reference to FIG. 1B, an oxygen introduction process performed by the control device 8 will be described. Supply of oxygen starts at a time point t1 at which supply of power I (W) is started by the oxygen generation power source 7 in order to cause the heat generating element 6 to generate heat. The oxygen generation power source 7 may employ a constant voltage control. In a case in which the heat generating element 6 is a metal resistor, when a voltage is rapidly applied to the metal resistor, a larger current may flow at a rise due to a low resistance value of the resistor. In this case, the heat generating element 6 and the oxygen generation unit 5 may be damaged by rapid heat generation. In order to prevent this situation, it is desirable to make a setting such that a waveform of the power I (W) is made blunted by delaying the rise when the voltage is applied, and then substantially constant power or a substantially constant voltage is applied. These set values are determined in advance as a condition in which an oxygen partial pressure $P_{O2}$ is $10^{-7}$ Pa or more.

After the time point t1, oxygen is generated from the oxygen generation unit 5, and the oxygen partial pressure $P_{O2}$ rises. At the same time, an emission current amount Ic emitted from the photocathode 1 measured by the emission current meter 4 also increases, but an increase in the current amount Ic is not observed when a peak value Icp is reached.

When the generation of oxygen is continued as it is, the emission current amount Ic decreases, and the supply of the power I (W) from the oxygen generation power source 7 is stopped at a time point t2 due to a deviation from an optimum condition.

The time point t2 may be set to a time point at which an increase rate of the emission current amount Ic becomes 0. Since the generation of oxygen from the oxygen generation unit 5 is not immediately stopped even when the supply of the power I (W) from the oxygen generation power source 7 is stopped, it is desirable to stop the supply of the power I (W) at a time point at which a change rate of the emission current amount Ic becomes equal to or less than a predetermined value. Alternatively, a value (stop value) smaller than an expected value of the peak value Icp may be set to stop the supply of the power I (W) at a time point when the emission current amount Ic becomes equal to or larger than the stop value.

In the oxygen introduction process, the power I (W) does not have to be set to the constant power or to have a constant voltage. For example, in FIG. 1C, the power I (W) from the oxygen generation power source 7 is increased in an initial stage (in this case, a rise waveform is also made blunted for the same reason as the waveform in FIG. 1B), and is gradually decreased. Accordingly, the oxygen partial pressure $P_{O2}$ also increases in the initial stage, and then gradually decreases. Therefore, the emission current amount Ic approaches to the peak value Icp earlier than in the case of the control shown in FIG. 1B, and then slowly fluctuates toward the peak value Icp, thus providing an advantage that controllability of the peak current Icp is improved.

FIG. 10 shows an activation step (Yo-Yo method) on the photocathode 1. A Cs deposition process by supply of power Ics to the Cs source 9 and the oxygen gas introduction process by the supply of the power I to the oxygen generation unit 5 are alternately repeated, the peak value of the emission current amount Ic is increased, and the emission current amount Ic finally reaches the predetermined value (set value). Then, Cs may be deposited excessively.

When the activation mechanism according to the present embodiment is used, for example, a Cs deposition time is 3 minutes and an oxygen introduction time is several minutes at a partial pressure in the order of $10^{-7}$ Pa, and when the above processes are repeated 3 times to 6 times, the activation on the photocathode 1 can be ended within about 20 minutes to 40 minutes.

FIG. 3 shows a configuration of an electron gun 15. The photocathode 1 that has been subjected to surface activation in an activation region 16 of the electron gun 15 is transferred by a linear introducer 17 onto a cathode stage 24 in an electron probe radiation region. Electron probe excitation light 21 emitted from a laser light source 22 passes through a window 23 provided in a vacuum container 29, is focused by a condenser lens 20, and enters a photoelectric film from a transparent substrate side of the photocathode 1. Accordingly, electrons are emitted from the photoelectric film of the photocathode 1 into the vacuum, and the emitted electrons are accelerated between extraction electrodes 26 by an acceleration power source 25 electrically connected to the cathode stage 24 to become an electron beam 27. The electron beam 27 passes through an aperture 28 and is guided to an electron optical system column 30. An electron lens, a deflector by an electromagnetic field, an electron beam detector, and the like are incorporated in the electron optical system column 30, which is typically used as a scanning electron microscope, a transmission electron microscope, and the like.

The electron beam 27 emitted from the photocathode 1 has high luminance and further has uniform energy, which contributes to high resolution and high-speed measurement as an electron microscope. Further, when a short pulse laser light source is used as the laser light source 22, a pulse electron beam can be obtained without adding a component to the electron optical system, which is useful for time resolution measurement or the like. The photocathode 1 may be housed in a conductive holder and moved as a cathode pack.

FIG. 4A shows a more specific configuration example of the activation region 16 of the electron gun 15. In the activation on the photocathode 1, surface cleaning is performed first, which is a step of removing an oxide and a carbide adhering to the surface of the photoelectric film of the photocathode 1. In the surface cleaning step, a cathode heater 45 is energized, the photocathode 1 is heated to about 400° C. by radiant heat from the cathode heater 45, hydrogen gas ($H_2$) passes through an atomic hydrogen generator 44, and a part of the hydrogen gas, as atomic hydrogen (H), is brought into contact with the surface of the photoelectric film to remove the oxide and the carbide on the surface of the photocathode 1 by a chemical reaction.

Next, a cathode contact 40 connected to the emission current meter 4 placed outside the vacuum container 29 is brought into electrical contact with the photoelectric film of the photocathode 1 by a wiring passing through a feedthrough 42 attached to a wall of the vacuum container 29. Accordingly, the photocathode 1 is maintained at a negative potential of about −10 V to −100 V, and the electrons are emitted from the photoelectric film, whereby a current flows toward a surrounding metal portion having a potential of 0 V (the wall of the vacuum container 29 and the like), and thus the emission current meter 4 measures a current value. FIG. 4C shows a specific circuit configuration example of the emission current meter 4. When measurement is started, a predetermined negative voltage is generated in the voltage source 46 by a signal from the control device 8 to a communication board 48. Since the photocathode 1 is maintained at a negative potential than a surrounding vacuum layer, the emitted electrons generated from the photocathode 1 flow out to the surrounding. At this time, an emission current is measured by an ammeter 47, and a current value is reported to the control device 8 via the communication board 48.

The excitation light 2 is generated from the light source device 3 placed outside the vacuum container 29, and is brought through an activation confirmation window 41 into a vacuum region in which the photocathode 1 is disposed. In order to prevent the cathode heater 45 from blocking the excitation light 2, a hole or the like may be formed in the cathode heater 45, or a position of the cathode heater 45 may be changed during irradiation with the excitation light 2. The Cs source 9 and the heat generating element 6 for generating oxygen are wired to respective power sources. Since the power sources are disposed outside the vacuum container 29, the Cs source 9 in the activation region 16 is connected to the Cs generation power source 12 by a wiring passing through a feedthrough 42. Meanwhile, in the example in FIG. 4A, the oxygen generation unit 5 has a configuration in which a Ag thin plate 35 is disposed between the atmosphere and the vacuum of the activation region 16, oxygen in the atmosphere is taken into the Ag thin plate 35 by heating by the heat generating element 36 and is diffused to inside of the Ag thin plate 35, and oxygen is released into the vacuum. As shown in FIG. 4B, a valve 43 may be provided between the Ag thin plate 35 that constitutes the oxygen generation unit 5 and the activation region 16 of the electron gun 15, and the valve 43 may be closed when the activation on the photocathode 1 is not performed. The same applies to a case in which other forms are employed as the oxygen generation unit 5.

FIG. 4A shows an example in which the Ag thin plate provided in a partition wall between the atmosphere and the vacuum is used as the substance that generates oxygen, and the invention is not limited to Ag. Although most of the metal oxides correspond to materials that release oxygen by heating, materials suitable for an oxygen supply application for the activation on the photocathode 1 are limited. For example, it can be said that $Cu_2O$ in copper oxides is a suitable material because the oxygen partial pressure at 200° C. is sufficiently lower than $10^{-6}$ Pa and oxygen in the order of $10^{-7}$ Pa is released by heating at several hundred degrees of Celsius. When $Cu_2O$ is used as oxygen generating means, a $Cu_2O$ powder is charged into a container such as the crucible as shown in FIG. 1A.

Further, stabilized zirconia in which calcium oxide, yttrium oxide, and the like are mixed facilitates conduction of oxygen ions by heating at about 500° C. or higher, and when the current flows in this state, oxygen is generated from a portion having a high oxygen density. FIG. 5A shows a configuration example of the oxygen generation unit 5 using the stabilized zirconia. A structure in which an anode electrode 51 and a cathode electrode 52 are provided on surfaces of the stabilized zirconia 50 facing each other is disposed in the activation region 16 of the electron gun 15, the stabilized zirconia 50 is heated to about 500° C. or higher by energizing the heat generating element 6 using a heating power source 55, and the stabilized zirconia 50 is energized by an electrode reaction power source 53 to generate oxygen. In this configuration, during the activation process, heating by the heat generating element 6 is continued, and energization and stopping energization of the stabilized zirconia 50 by the electrode reaction power source 53 are performed, whereby generation and stopping generation of oxygen can be switched at a high speed. By using this method, one cycle of oxygen introduction process may be performed a plurality of times in a pulse form. FIG. 2 shows the state. Oxygen is generated in the pulse form in accordance with the pulse power I (W) from the electrode reaction power source 53. In this case, since the increase rate of the emission current amount Ic can be measured for each pulse, measurement accuracy for the peak current Icp can be improved.

FIG. 5B shows another configuration example of the oxygen generation unit 5 using the stabilized zirconia. The stabilized zirconia 50 is disposed on a part of a vacuum container wall 56 in which the electron gun 15 is incorporated, the anode electrode 51 is provided on the surface of the stabilized zirconia 50 located on a vacuum side, and the cathode electrode 52 is provided on the surface of the stabilized zirconia 50 located on an atmosphere side. The heat generating element 6 that heats the stabilized zirconia 50 is also disposed on the atmosphere side, that is, outside the vacuum container. Therefore, since oxygen is supplied from the atmosphere to the cathode electrode 52 without any concern of the gas released from the heat generating element 6 with only a small number of the feedthroughs 42 provided in the vacuum container, the stabilized zirconia has an advantage of being capable of being used stably for a long time even when a volume of the stabilized zirconia 50 is reduced.

FIG. 5C shows still another configuration example of the oxygen generation unit 5 using the stabilized zirconia. The stabilized zirconia 50 itself is energized and heated, and an electrode reaction also proceeds. Accordingly, the power source can be implemented only by the oxygen generation power source 7.

In contrast, examples of a material that generates oxygen by heating but is not suitable for an oxygen generation application for the activation on the photocathode 1 include a substance that generates a large amount of oxygen at about 200° C. or lower, for example, silver oxide. In order to stably operate an NEA photocathode, it is necessary to make the inside of the electron gun 15 a very high vacuum with an extremely small amount of residual gas; at the time of vacuum evacuating of the device, a step of performing baking at a high temperature and releasing an adsorbed residual gas is necessary. Since the baking is also performed at a temperature of 200° C. or higher, a substance that generates a large amount of oxygen at a temperature during the baking is not suitable.

A peroxide of an alkali metal or an alkali soil metal, such as $BaO_2$, generates oxygen by heating, but explosively reacts with water, and thus has features of easily reacting with moisture in the air at the time of assembly or maintenance of the device, having severe wear and alteration, and a high vapor pressure of a metal produced by reduction, and is likely to cause deterioration of the photocathode and an insulator, which is thus not desirable.

By using the activation mechanism according to the present embodiment, it is possible to automate the surface activation process on the photocathode 1. As shown in FIG. 6, the control device 8 is connected to a computer 60 and is controlled by the computer 60. The computer 60 includes a processor 61, a memory 62, and a storage 63 which are connected to a bus 64, generates a command to an electron beam application device based on an instruction of a user via an input device (not shown), and instructs the control device 8 to output data acquired by the electron beam application device to an output device (not shown). FIG. 6 shows a function related to the photocathode 1.

The processor 61 calls and executes a program stored in the storage 63 to execute a predetermined function. As a function related to the surface activation on the photocathode 1, there are prediction calculation, surface activation control, and deterioration determination, which will be described later. The processor 61 functions as a prediction calculation unit 61A, a surface activation control unit 61B, and a deterioration determination unit 61C by executing a corresponding program. The memory 62 is a random access memory and temporarily stores data and a program. The storage 63 includes a hard disk drive (HDD), a solid state drive (SSD), and the like, and stores data and the program in a nonvolatile manner.

FIG. 7 shows a flowchart when the photocathode 1 is used as the electron source in the electron beam application device. As described above, by performing surface cleaning on the photocathode 1 (S01) and subsequently performing surface activation (S02), the photocathode 1 can be used as the electron source. Then, the photocathode 1 is transferred to the electron probe radiation region of the electron gun 15, electrons are emitted with the electron gun 15 and SEM observation is performed (S03). At an appropriate timing, a probe current emitted from the electron gun 15 is measured, and the prediction calculation unit 61A determines whether the probe current is equal to or greater than a set value (S04). A usage history of the photocathode 1 and the set value for the electron gun 15 are recorded in the storage 63. The prediction calculation unit 61A determines whether an expected probe current amount is obtained based on the set value and the history of the photocathode 1 stored in the storage 63. When the expected probe current amount is not obtained, Cs is additionally deposited on the surface of the photocathode 1 (S05). Then, the probe current amount is measured again, and the prediction calculation unit 61A determines whether the probe current is equal to or greater than the set value (S06). When the probe current amount is recovered, the photocathode 1 is continuously used, and when the probe current amount is not recovered, the surface activation process on the photocathode 1 is executed again.

FIG. 8 shows a detailed flow of the surface activation process (S02) executed by the surface activation control unit 61B. The photocathode 1 is moved to the activation region 16 of the electron gun 15 to execute the surface activation process. As described above, the excitation light is applied to start measurement for the emission current (S11). First, Cs is deposited, which is an alkali metal for the surface activation (S12). It is assumed that a Cs deposition amount is time-controlled. Subsequently, oxygen is introduced (S13). The oxygen introduction process is performed by monitoring the emission current amount by the emission current meter 4 (S14). When the increase in the emission current satisfies a predetermined stop criterion, the oxygen introduction is stopped (S15). It is determined whether the emission current amount is equal to or larger than a set value (S16), and when the emission current amount is less than the set value, a Ca deposition process and the oxygen introduction process are repeatedly performed (see FIG. 10). When the emission current amount is equal to or larger than the set value, Cs is finally deposited (S17), and the surface activation process ends (S18).

Accordingly, the photocathode 1 can be used while recovering the emission current amount by repeating the surface activation process. However, when deterioration of the photocathode 1 progresses over a long time use, the emission current amount may not be sufficiently recovered. Therefore, the deterioration determination unit 61C determines the deterioration of the photocathode. As shown in a flowchart in FIG. 9A, after the surface activation on the photocathode 1 (S02), the deterioration determination unit 61C measures the emission current amount and determines whether the emission current amount is sufficient (S31). When the deterioration of the photocathode progresses, an alarm is issued to a user to recommend for a replacement of the photocathode 1 (S32).

FIG. 9B shows a temporal change of an emission current amount Ipeak (see FIG. 10) when the surface activation process ends. In measurement of the emission current amount Ipeak, the measurement is performed under the same condition such as an excitation light intensity affecting the current amount. A region A is an initial region in which no deterioration occurs and the same degree of emission current amount is obtained every time due to the surface activation. A region B is a temporal region in which the emission current amount Ipeak does not recover by the surface activation due to dirt that cannot be removed even by the surface activation and the deterioration of the photocathode. A region C is a degradation region in which the dirt or the deterioration further progresses and a decrease in the emission current amount Ipeak does not stop. The deterioration determination unit 61C estimates a position of the photocathode 1 in a deterioration curve of, for example, the photocathode shown in FIG. 9B based on the usage history of the photocathode 1 and the measured emission current amount Ipeak, and recommends a replacement according to a degree of deterioration of the photocathode.

In this case, the number of times of activation and the emission current amount Ipeak are stored in the storage 63 as a model that deteriorates according to a usage duration. The deterioration determination unit 61C can determine the degree of deterioration of the photocathode 1 using the model stored in the storage 63. In practice, when the photocathode 1 is used as the electron source, properties of the photocathode 1, such as the necessary Cs deposition amount and oxygen introduction amount and a lifetime, are changed depending on many parameters such as a change in a degree of vacuum inside the vacuum container, a generated probe current amount, an emission time, an emission stop time, and a temperature. Therefore, a correlation model is created in which these parameters that affect the properties of the photocathode 1 are used as explanatory variables, and control parameters (such as Cs deposition amount and oxygen introduction amount) in the surface activation process on the photocathode 1 and the lifetime as a result thereof are set as objective variables. By storing the correlation model in the storage 63 and performing the surface activation process by the surface activation control unit 61B using the correlation model, high luminance and a monochromatic property of the photocathode 1 can be kept stable for a long time, and a timing of maintenance can be optimized.

An example has been described in which the deterioration determination is performed or the control parameters in the surface activation process is optimized based on the emission current value Ipeak. Instead of the emission current value Ipeak, the probe current output from the electron gun 15 may be used.

As described above, the surface activation process on the photocathode has been described based on the Yo-Yo method in which the Cs deposition time and the oxygen introduction time are separate from each other, and the oxygen introduction control described as the present embodiment can be applied even in a case of applying a co-deposition method in which the Cs deposition time and the oxygen introduction time overlap each other. FIG. 11 shows an example of an activation step on the photocathode 1 by the co-deposition method. The activation step is performed under a condition in which a Cs introduction amount and the oxygen introduction amount are optimized.

The invention has been described above with reference to the embodiments and the modifications. The embodiments and the modifications described above may be modified in various ways without departing from the scope of the invention, and may be used in combination.

REFERENCE SIGNS LIST

1: photocathode
2: excitation light
3: light source device
4: emission current meter
5: oxygen generation unit
6, 36: heat generating element
7: oxygen generation power source
8: control device
9: Cs source
10: photoelectric film
11: transparent substrate
12: Cs generation power source
15: electron gun
16: activation region
17: linear introducer
20: condenser lens

21: electron probe excitation light
22: laser light source
23: window
24: cathode stage
25: acceleration power source
26: extraction electrode
27: electron beam
28: aperture
29: vacuum container
30: electron optical system column
35: Ag thin plate
40: cathode contact
41: activation confirmation window
42: feedthrough
43: valve
44: atomic hydrogen generator
45: cathode heater
46: voltage source
47: ammeter
48: communication board
50: stabilized zirconia
51: anode electrode
52: cathode electrode
53: electrode reaction power source
55: heating power source
56: vacuum container wall
60: computer
61: processor
61A: prediction calculation unit
61B: surface activation control unit
61C: deterioration determination unit
62: memory
63: storage
64: bus

The invention claimed is:

1. An electron beam application device comprising:
an electron gun having an electron probe radiation region and an activation region, and including a photocathode configured to be transferred between the electron probe radiation region and the activation region;
an electron optical system column into which an electron beam emitted by irradiating the photocathode disposed in the electron probe radiation region with excitation light is introduced;
an activation mechanism disposed in the activation region;
a control device configured to control the activation mechanism; and
a computer configured to control the control device and execute a surface activation process on the photocathode by the activation mechanism, wherein
the activation mechanism includes
a light source device configured to irradiate the photocathode disposed in the activation region with the excitation light,
an alkali metal source configured to be deposited on a surface of the photocathode in the surface activation process,
a first power source configured to energize the alkali metal source to generate alkali metal vapor,
a heat generating element,
an oxygen generation unit configured to generate oxygen by heating the heat generating element, and
an emission current meter configured to monitor an emission current generated by electron emission when the photocathode is irradiated with the excitation light from the light source device, and
in the surface activation process, the computer performs control such that the photocathode is irradiated with the excitation light from the light source device, an emission current amount of the photocathode is monitored by the emission current meter, the heat generating element is heated to generate oxygen by the oxygen generation unit, and the heating of the heat generating element is stopped when the emission current amount of the photocathode satisfies a predetermined stop criterion.

2. The electron beam application device according to claim 1, wherein
the computer stops the heating of the heat generating element when the emission current amount of the photocathode is equal to or more than a predetermined value or when a change rate of the emission current amount of the photocathode is equal to or less than a predetermined value.

3. The electron beam application device according to claim 1, wherein
the activation mechanism includes a second power source configured to supply power for causing the heat generating element to generate heat, and
the control device causes the heat generating element to generate heat by supplying the power from the second power source to the heat generating element.

4. The electron beam application device according to claim 3, wherein
the power supplied from the second power source to the heat generating element has a waveform a rise of which is made blunted.

5. The electron beam application device according to claim 4, wherein
the power supplied from the second power source to the heat generating element is constant power or has a constant voltage, or has a waveform gradually decreasing compared with an initial stage.

6. The electron beam application device according to claim 3, wherein
the control device repeatedly supplies pulse power from the second power source to the heat generating element.

7. The electron beam application device according to claim 3, wherein
a valve is provided between the oxygen generation unit and the activation region, and
the valve is closed when surface activation on the photocathode is not performed.

8. The electron beam application device according to claim 3, wherein
the oxygen generation unit is an Ag thin plate disposed between an atmosphere and a vacuum of the activation region.

9. The electron beam application device according to claim 3, wherein
the oxygen generation unit includes stabilized zirconia, an anode electrode and a cathode electrode respectively provided on surfaces facing the stabilized zirconia, and a third power source configured to energize the stabilized zirconia through the anode electrode and the cathode electrode.

10. The electron beam application device according to claim 9, wherein
the stabilized zirconia is disposed on a wall of a vacuum container containing the electron gun, the anode electrode and the cathode electrode are disposed on a vacuum side and an atmosphere side with a wall of the vacuum container interposed therebetween, and the heat generating element is disposed outside the vacuum container.

11. The electron beam application device according to claim 1, wherein in the surface activation process, the computer repeatedly performs an alkali metal deposition process in which the alkali metal vapor is generated to deposit an alkali metal on the surface of the photocathode, and an oxygen introduction process in which oxygen is generated by the oxygen generation unit, and in the oxygen introduction process, when the emission current amount of the photocathode at the time of satisfying the predetermined stop criterion is equal to or greater than a set value, the computer ends repetition of the alkali metal deposition process and the oxygen introduction process.

12. The electron beam application device according to claim 11, wherein the computer includes information indicating temporal degradation based on a usage history of the photocathode, and recommends replacement of the photocathode based on the information and an emission current amount of the photocathode when the surface activation process ends.

13. The electron beam application device according to claim 1, wherein the computer includes a correlation model having a parameter that affects a property of the photocathode as an explanatory variable and a control parameter in the surface activation process as an objective variable, and determines a control parameter in the surface activation process using the correlation model.

14. The electron beam application device according to claim 13, wherein the objective variable of the correlation model includes a lifetime of the photocathode, and the control parameter, which is the objective variable of the correlation model, includes a deposition amount of an alkali metal from the alkali metal source and an oxygen introduction amount to the photocathode.

15. The electron beam application device according to claim 1, wherein the alkali metal source is a Cs source.

* * * * *